(12) United States Patent
Chen et al.

(10) Patent No.: US 12,400,708 B2
(45) Date of Patent: Aug. 26, 2025

(54) MEMORY DEVICE AND METHOD FOR REDUCING ACTIVE POWER CONSUMPTION THEREOF USING ADDRESS CONTROL

(71) Applicant: TAIWAN SEMICONDUCTOR MANUFACTURING COMPANY LTD., Hsinchu (TW)

(72) Inventors: Chien-Yuan Chen, Hsinchu (TW); Hau-Tai Shieh, Hsinchu (TW); Cheng Hung Lee, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 198 days.

(21) Appl. No.: 18/330,353

(22) Filed: Jun. 6, 2023

(65) Prior Publication Data

US 2024/0412774 A1   Dec. 12, 2024

(51) Int. Cl.
   *G11C 11/419*   (2006.01)
   *G11C 11/418*   (2006.01)

(52) U.S. Cl.
   CPC .......... *G11C 11/419* (2013.01); *G11C 11/418* (2013.01)

(58) Field of Classification Search
   CPC .... G11C 11/419; G11C 11/418; G11C 11/413
   See application file for complete search history.

(56) References Cited

U.S. PATENT DOCUMENTS

2014/0092674 A1* 4/2014 Chung ................... G11C 7/065
                                                        365/154
2022/0189541 A1* 6/2022 Yang ..................... G11C 11/419

\* cited by examiner

*Primary Examiner* — Jay W. Radke
(74) *Attorney, Agent, or Firm* — WPAT LAW; Anthony King

(57) ABSTRACT

The present disclosure provides a memory device, including a memory array, a tracking circuit, a memory controller, and a word line driver. A plurality of word lines are in communication with a plurality of memory cells of the memory array. The memory controller decodes a memory address of a memory access command to generate a decoded row address signal. The word line driver is configured to assert one of the plurality of word lines in response to the decoded row address signal. In response to detecting a switching event of a clock control signal derived from an input clock signal of the memory device, the memory controller asserts an tracking acceleration signal obtained from a tracking word line of the memory device to activate one or more first tracking arrays of the plurality of tracking arrays to pull down a voltage level of a tracking bit line.

20 Claims, 15 Drawing Sheets

MEMORY DEVICE AND METHOD FOR REDUCING ACTIVE POWER CONSUMPTION THEREOF USING ADDRESS CONTROL

BACKGROUND

The present disclosure relates to memory devices, and, in particular, to a memory device and a method for reducing active power consumption thereof using address control.

Static random access memory (SRAM) is often used in integrated circuits and systems-on-chip. However, the read margins of bit lines of memory cells in an SRAM may differ between the word lines associated with the least significant bit (LSB) and the most significant bit (MSB) of an address received by the memory controller of the SRAM, resulting in higher active power during memory read or memory write operations.

BRIEF DESCRIPTION OF THE DRAWINGS

Aspects of the present disclosure are best understood from the following detailed description when read with the accompanying figures. It is emphasized that, in accordance with standard practice in the industry, various features are not drawn to scale. In fact, the dimensions of the various features can be arbitrarily increased or reduced for clarity of discussion.

DETAILED DESCRIPTION

Figure 1A:
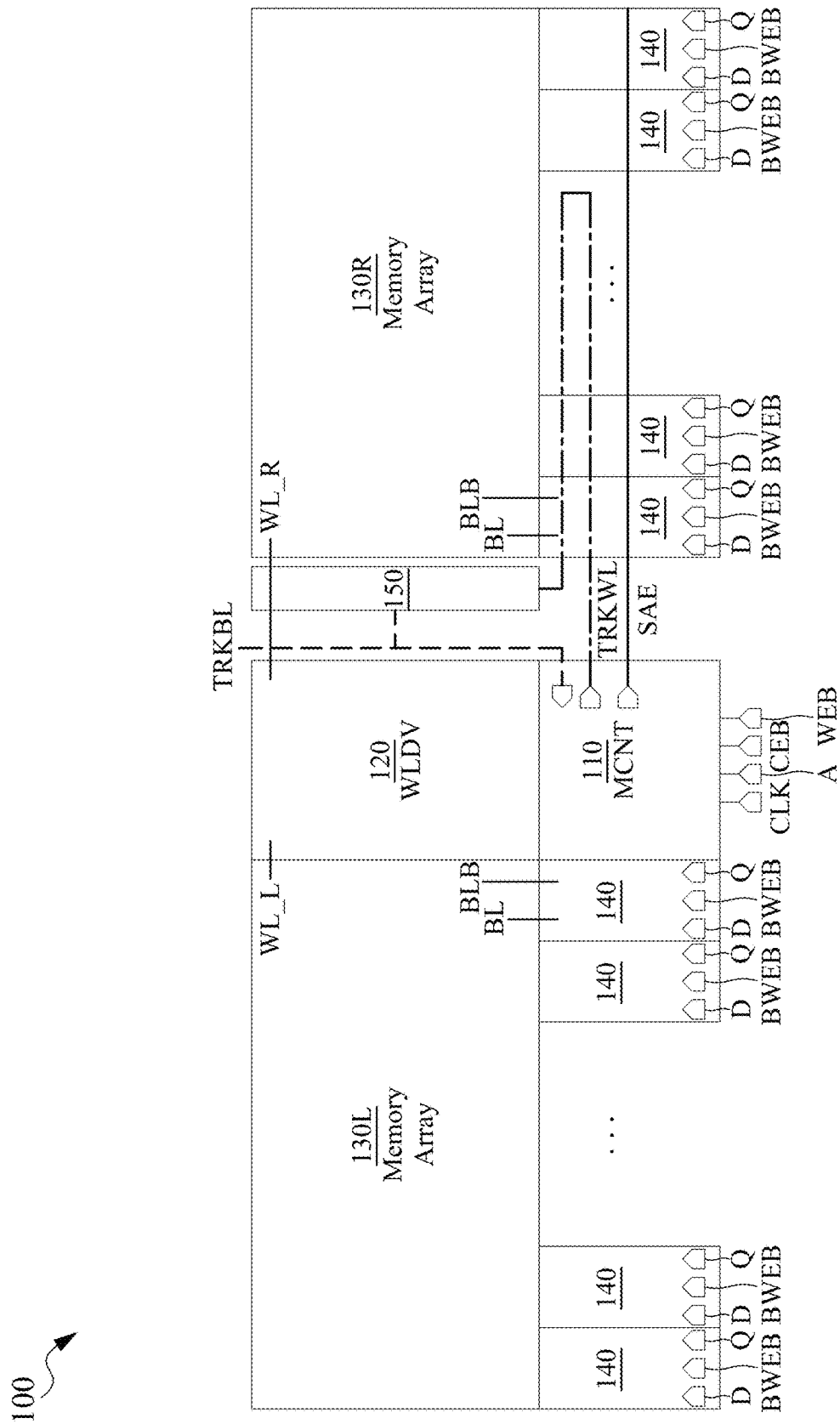
FIG. 1A is a block diagram of a memory device 100 in accordance with an embodiment of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features can be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, it will be understood that when an element is referred to as being "connected to" or "coupled to" another element, it can be directly connected to or coupled to the other element, or intervening elements can be present.

Embodiments, or examples, illustrated in the drawings are disclosed as follows using specific language. It will nevertheless be understood that the embodiments and examples are not intended to be limiting. Any alterations or modifications in the disclosed embodiments, and any further applications of the principles disclosed in this document are contemplated as would normally occur to one of ordinary skill in the pertinent art.

Further, it is understood that several processing steps and/or features of a device can be only briefly described. Also, additional processing steps and/or features can be added, and certain of the following processing steps and/or features can be removed or changed while still implementing the claims. Thus, it is understood that the following descriptions represent examples only, and are not intended to suggest that one or more steps or features are required.

In addition, the present disclosure may repeat reference numerals and/or letters in the various examples. This repetition is for the purpose of simplicity and clarity and does not in itself dictate a relationship between the various embodiments and/or configurations discussed.

FIG. 1A is a block diagram of a memory device 100 in accordance with an embodiment of the disclosure.

In some embodiments, the memory device 100 may be a static random access memory (SRAM). The memory device 100 may be implemented as a standalone memory chip, or be integrated into an integrated circuit or system-on-chip. As shown in FIG. 1A, the memory device 100 may include a memory controller (abbreviated as MCNT) 110, a word line driver (abbreviated as WLDV) 120, memory arrays 130L and 130R, input/output (I/O) pads 140, and a tracking circuit 150. The memory controller 110 may be configured to receive an input memory command, and decode the input memory command to generate a decoded row address signal and a decoded column address signal. For example, the input memory command may include an address signal A, a chip enable signal CEB, and a write enable signal WEB. The chip enable signal CEB and the write enable signal WEB may be low active signals.

The word line driver 120 may be configured to assert one of the word lines of the memory arrays 130L and 130R in response to the decoded row address signal. The memory arrays 130L and 130R can be collectively referred to as the memory array 130.

The memory arrays 130L and 130R may include a plurality of memory cells arranged in a two-dimensional array. The plurality of memory cells in the memory arrays 130L and 130R are controlled by a plurality of word lines and bit lines, and the value of the activated memory cell (i.e., with the corresponding word line and bit line pair are activated) will be read by the bit line pair (i.e., BL and BLB) that is electrically connected to a sense amplifier (not shown) controlled by the sense amplifier enable signal SAE issued by the memory controller 110. When the corresponding sense amplifier of the activated memory cell is enabled, the value of the activated memory cell will be read to the corresponding I/O pad 140 by the sense amplifier. For example, each of the I/O pads 140 may include I/O pins such as D, BWEB, and Q.

The tracking circuit 150 may be configured to monitor voltage levels of the word lines of the memory array 130L and 130R using a tracking word line TRKWL and a tracking bit line TRKBL, and transmit a tracking bit line TRKBL to the memory controller 110. In some embodiments, the memory controller 110 may assert the sense amplifier enable signal SAE in response to detecting a falling edge of the tracking bit line TRKBL. Although the tracking word line TRKWL is illustrated as being disposed on the I/O pads 140 in FIG. 1A, the tracking word line TRKWL is not at the same layer as the I/O pads 140, and the tracking word line TRKWL may be implemented by an individual metal layer different from the layer on which the I/O pads 140 are formed during manufacture of the memory device 100.

Figure 1B:
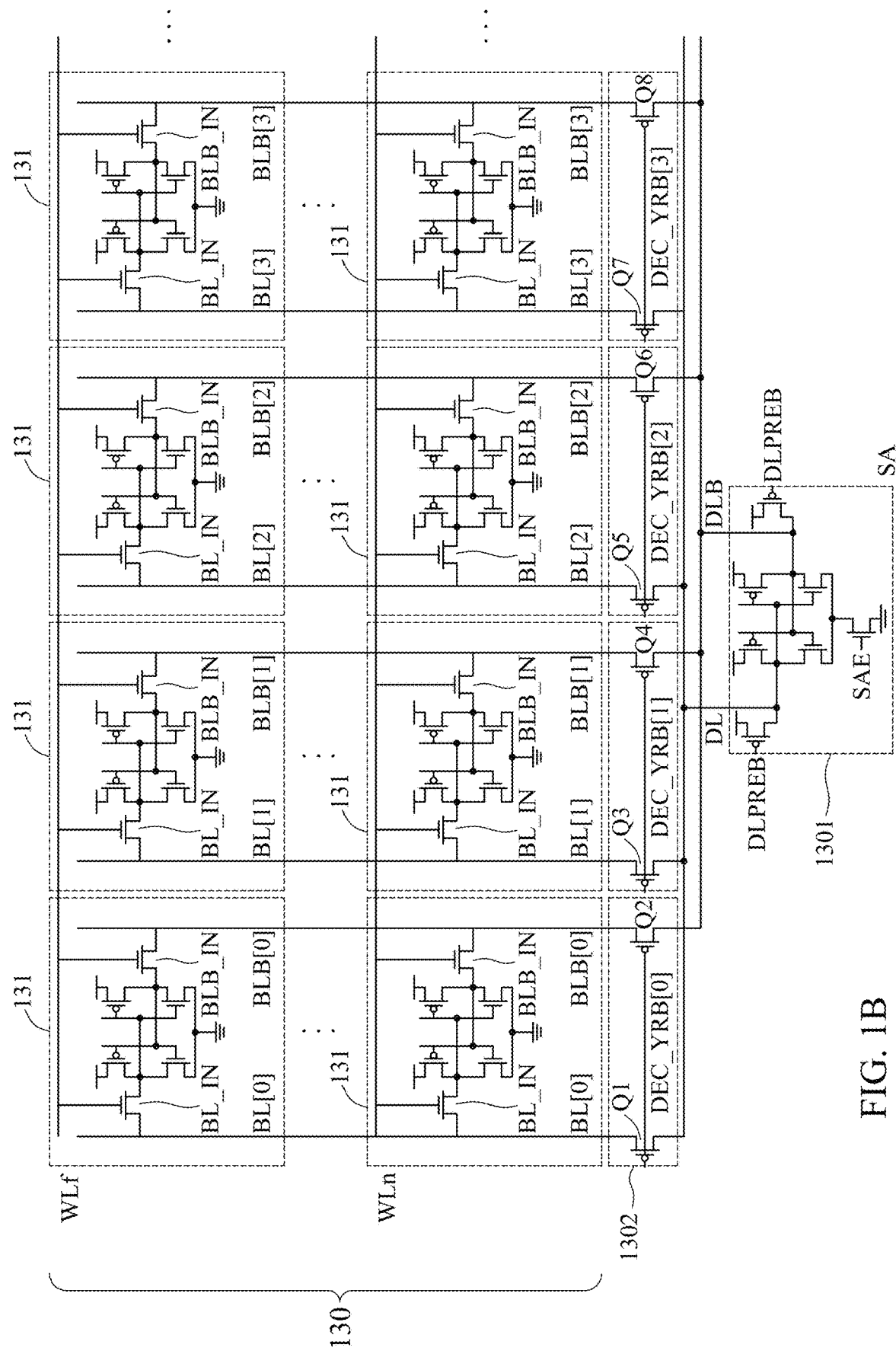
FIG. 1B is a schematic diagram of the memory array and sense amplifier in accordance with the embodiment of FIG. 1A.
Figure 1C:
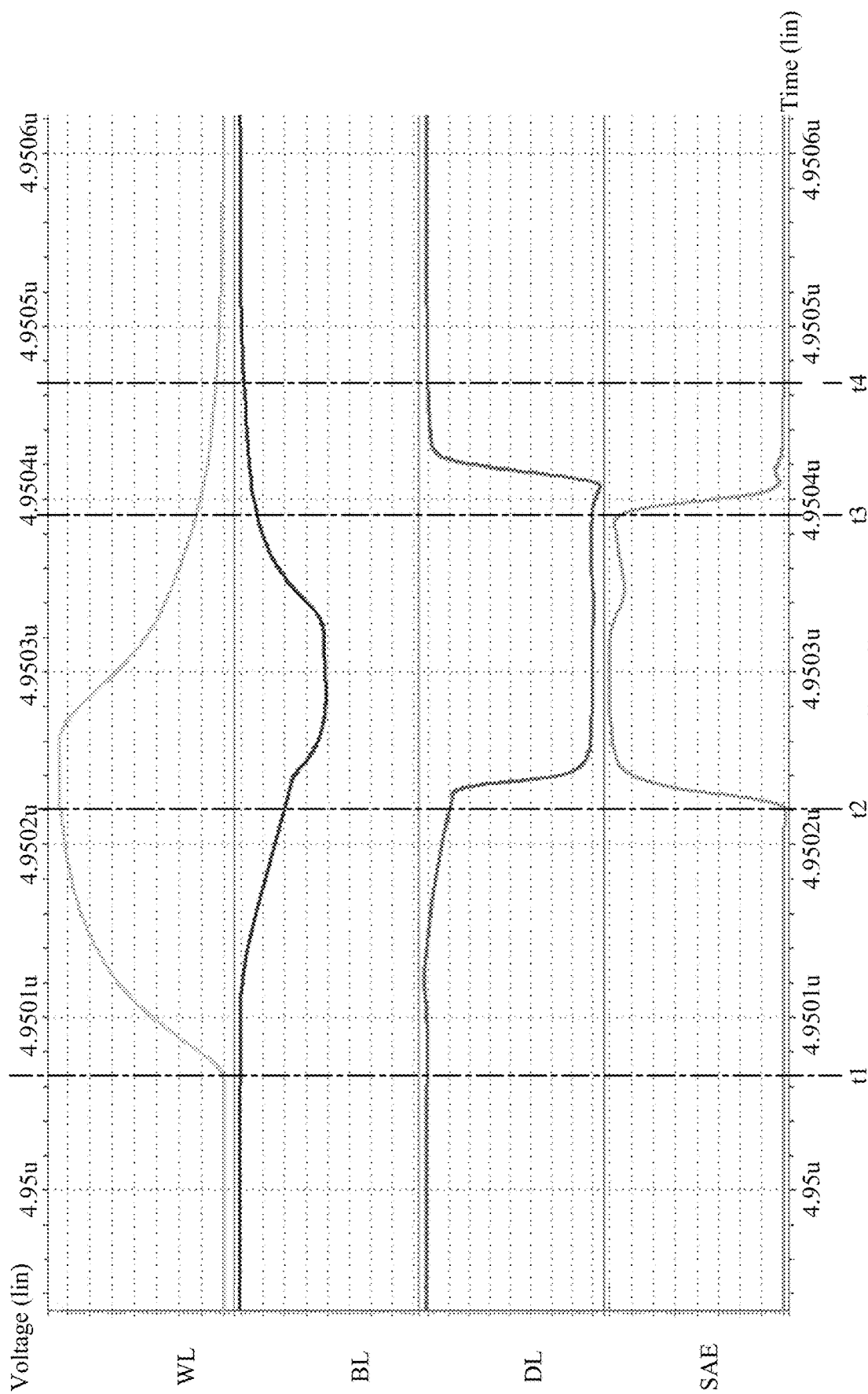
FIG. 1C is a waveform diagram of various signals with regard to a memory read operation accordance with the embodiment of FIG. 1B.

FIG. 1B is a schematic diagram of the memory array and sense amplifier in accordance with the embodiment of FIG. 1A. FIG. 1C is a waveform diagram of various signals with regard to a memory read operation accordance with the embodiment of FIG. 1B. Please refer to FIGS. 1A-1C.

In an embodiment, the bit line pair (i.e., BL and BLB) and the data line pair (i.e., DL and DLB) are pre-charged before every memory read cycle. When a memory read command is sent to the memory controller 110, the memory controller 110 may decode the memory address indicated by the memory read command, and send the decoded row address to the word line driver 120. Thus, the word line driver 120 may assert (or activate) one of the word lines of the memory arrays 130L or 130R in response to the decoded row address, as shown by time t1 of FIG. 1C. Then, the voltage level of one of the bit lines BL or BLB will be pulled down, and the voltages levels of the bit lines BL and BLB respectively transferred to the data line DL and DLB through the column selection circuit 1302.

The decoded column address generated by the memory controller 110 may activate one switch pair (e.g., Q1 & Q2, Q3 & Q4, Q5 & Q6, Q7 & Q8, and so on), so that the value stored in the memory cells 131 on the asserted word line will be obtained at the corresponding bit line pair. For example, one bit of the decoded column address DEC_YRB is 0, and the remaining bits of the decoded column address DEC_YRB are all 1. Given that the decoded column address DEC_YRB[0] is 0, other bits in the decoded column address DEC_YRB are all 1. This indicates that the switches Q1 and Q2 are turned on, so the values on the bit lines BL[0] and BLB[0] can be transferred to the data lines DL and DLB.

In response to the voltage difference between the data lines DL and DLB being greater than a predetermined voltage (i.e., at time t2), the memory controller 110 will assert the sense amplifier enable signal SAE to turn on the sense amplifier 1301 (i.e., at time t2). At this time, the voltage level of the data line DL will be pulled down to the ground (e.g., 0V) by the sense amplifier 1301 in a very short time. Therefore, the voltage difference between the data lines DL and DLB will be detected by the sense amplifier 1301 to generate an output read value for the memory read command. Afterwards, the voltage level of the asserted word line will gradually decrease to 0V. In response to the voltage of the asserted word line being lower than a predetermined voltage (i.e., at time t3), the memory controller 110 may de-assert the sense amplifier enable signal SAE to complete the memory read operation, and the data lines DL and DLB will be pre-charged to the high-logic state (i.e., at time t4) for the next memory read cycle.

Figure 2:
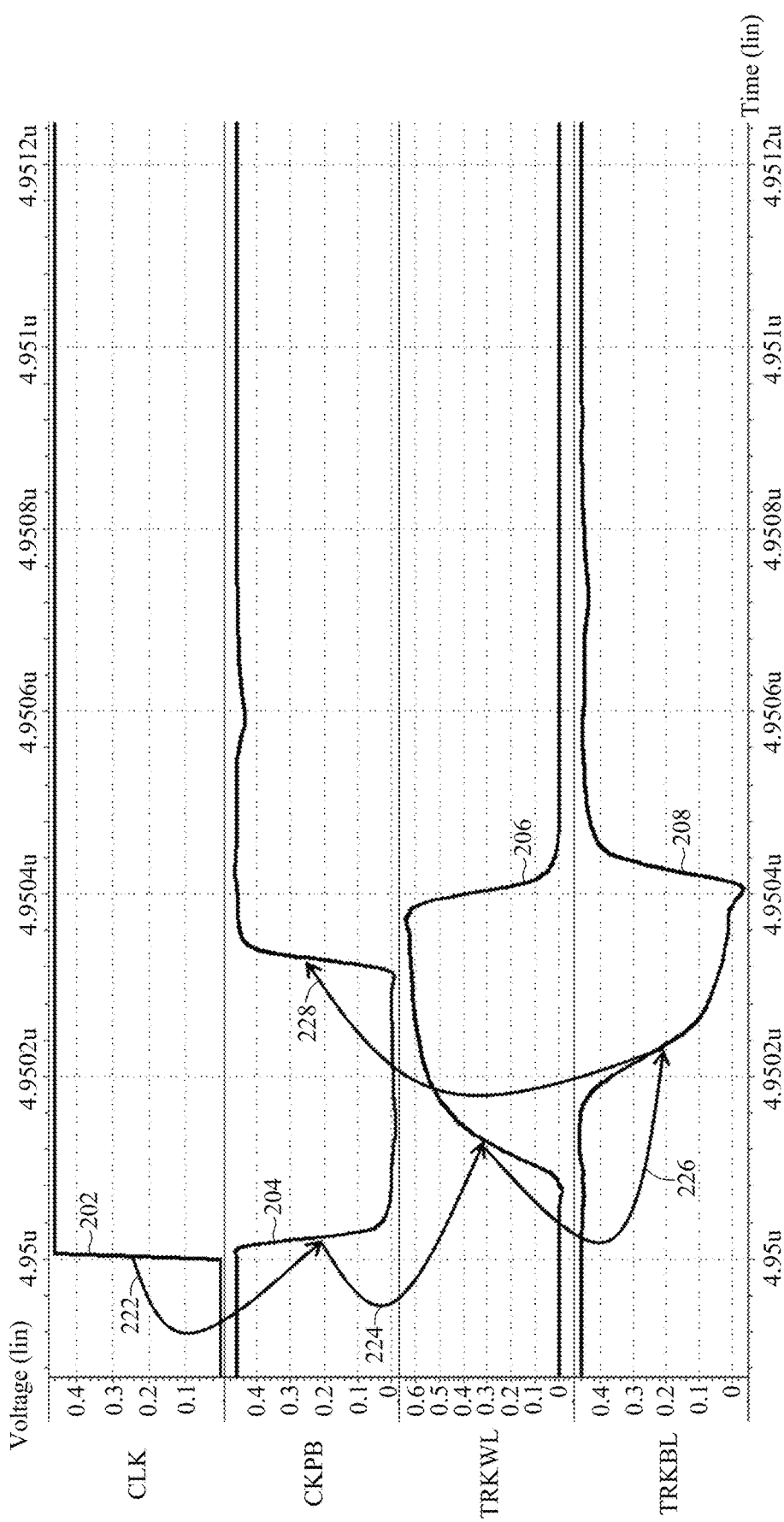
FIG. 2 is a waveform diagram of various signals for controlling the tracking bit line TRKBL in accordance with the embodiment of FIG. 1A.

FIG. 2 is a waveform diagram of various signals for controlling the tracking bit line TRKBL in accordance with the embodiment of FIG. 1A. Please refer to FIG. 1A and FIG. 2.

In an embodiment, the clock signal CLK (i.e., curve 202) is provided to the memory controller 110. In response to the clock signal CLK being switched from a low logic state to a high logic state, a control clock signal CKPB (i.e., curve 204) will be switched from the high logic state to the low logic state by the memory controller 110, as shown by arrow 222. It should be noted that the control clock signal CKPB is a low active signal. In response to detecting a falling edge of the control clock signal CKPB, the memory controller 110 will assert the tracking word line TRKWL (i.e., curve 206), as shown by arrow 224. The tracking word line TRKWL will activate the tracking circuit 150, and the tracking circuit 150 may pull down the voltage level of the tracking bit line TRKBL (i.e., curve 208) in response to detecting a rising edge of the tracking word line TRKWL, as shown by arrow 226.

In response to the memory controller 110 detecting a falling edge of the voltage level of the tracking bit line TRKBL, the memory controller 110 will switch the control clock signal CKPB from the low logic state to the high logic state, as shown by arrow 228. After the control clock signal CKPB is in the high logic state, the memory controller 110 will de-assert the tracking word line TRKWL, and therefore the tracking circuit 150 is deactivated, and the bit line tracking signal is switched from the low logic state to the high logic state. It should be noted that the rising edge of the clock control signal CKPB may be a source of back-edge signals (i.e., falling-edge-triggered signals) within the memory device 100. Moreover, the active power of the memory device 100 may be determined by the duration of the clock control signal CKPB being in the low logic state.

Figure 3:
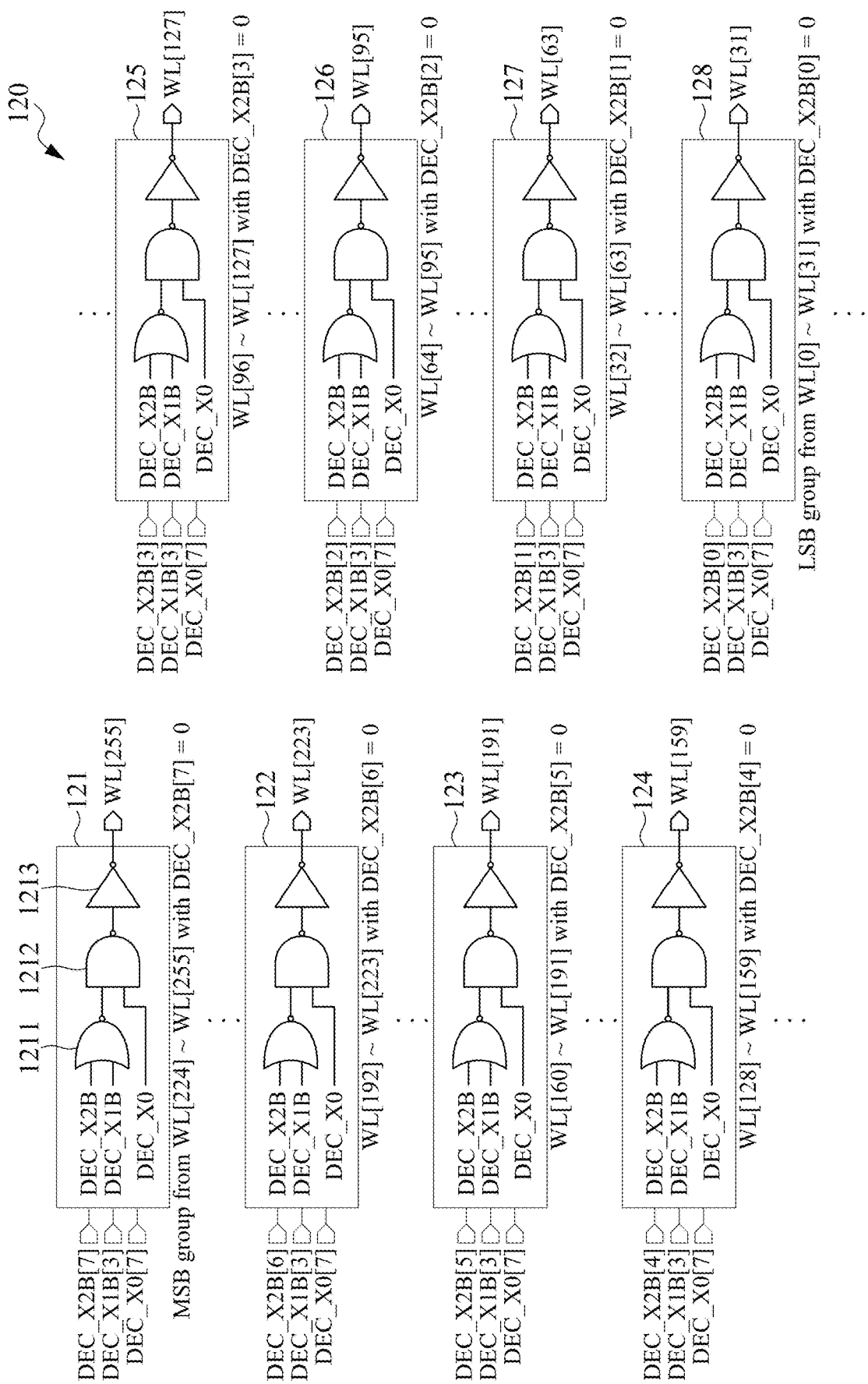
FIG. 3 is a schematic diagram of the word line driver 120 in accordance with the embodiment of FIG. 1A.

FIG. 3 is a schematic diagram of the word line driver 120 in accordance with the embodiment of FIG. 1A. Please refer to FIG. 1A and FIG. 3.

In an embodiment, given the memory type of the memory device 100 may be 1024×144 and there are 256 word lines of the memory array 130, the word line driver 120 may include eight word-line control sections. The memory controller 110 may receive an input memory command indicating a memory address A, and it may decode the memory address A to generate the decoded row address signal which includes a first decoded row address signal DEC_X2B[7:0], a second decoded row address signal DEC_X1B[3:0], and a third decoded row address signal DEC_X0[7:0].

Specifically, the word-line control sections 121 to 128 are respectively controlled by different bits in the first decoded row address signal DEC_X2B[7:0], and each of the word-line control sections 121 to 128 may control 32 word lines of the memory array 130. For purposes of description, the eight word-line control sections from the MSB to the LSB of the first decoded row address signal DEC_X2B[7:0] are shown by the word-line control circuits 121 to 128, respectively. It should be noted that the size of the memory device 100, the number of word lines, and the number of word-line control sections may be changed according to practical needs.

For example, the word-line control circuit 121 may indicate a most-significant-bit (MSB) section which controls word lines WL[224] to WL[255] (i.e., 32 word lines) when the MSB of the first decoded row address signal DEC_X2B [7] is 0. The word-line control circuit 122 may control word lines WL[192] to WL[223] (i.e., 32 word lines) when the seventh bit (i.e., counted from the LSB) of the first decoded row address signal DEC_X2B[6] is 0. The word-line control circuit 123 may control word lines WL[160] to WL[191] (i.e., 32 word lines) when the sixth bit of the first decoded row address signal DEC_X2B[5] is 0. The word-line control circuit 124 may control word lines WL[128] to WL[159] (i.e., 32 word lines) when the fifth bit of the first decoded row address signal DEC_X2B[4] is 0. The word-line control circuit 125 may control word lines WL[96] to WL[127] (i.e., 32 word lines) when the fourth bit of the first decoded row address signal DEC_X2B[3] is 0. The word-line control circuit 126 may control word lines WL[64] to WL[95] (i.e., 32 word lines) when the third bit of the first decoded row address signal DEC_X2B[2] is 0. The word-line control circuit 127 may control word lines WL[32] to WL[63] (i.e., 32 word lines) when the second bit of the first decoded row address signal DEC_X2B[1] is 0. The word-line control circuit 128 may indicate the least-significant-bit (LSB) section which controls word lines WL[0] to WL[31] when the LSB of the first decoded row address DEC_X2B[0] is 0.

Taking the word-line control circuit 121 as an example, the word-line control circuit 121 may include a NOR gate 1211, a NAND gate 1212, and an inverter 1213. When the MSB (i.e., DEC_X2B[7]) of the first decoded row address signal DEC_X2B is 0, the output of the NOR gate 1211 is determined by the MSB (i.e., DEC_X1B[3]) of the second decoded row address signal DEC_X1B. In addition, the MSB (i.e., DEC_X0[7]) of the third decoded row address signal DEC_X0 may be regarded as a clock signal of the word-line control circuit 121.

For example, when the MSB of the first decoded row address signal DEC_X2B[7] is 0 and the MSB of the second decoded row address signal DEC_X1B[3] is 0, the output signal of the word-line control circuit 121 will be determined by the MSB (i.e., DEC_X0[7]) of the third decoded row address signal DEC_X0. That is, when the MSB (i.e., DEC_X0[7]) of the third decoded row address signal DEC_X0 is 1, the output signal of the word-line control circuit 121 will be in the high logic state (i.e., logic 1), and the word line WL[255] controlled by the word-line control circuit 121 is asserted, so the memory cells on the activated word line WL[255] are turned on.

Figure 4:
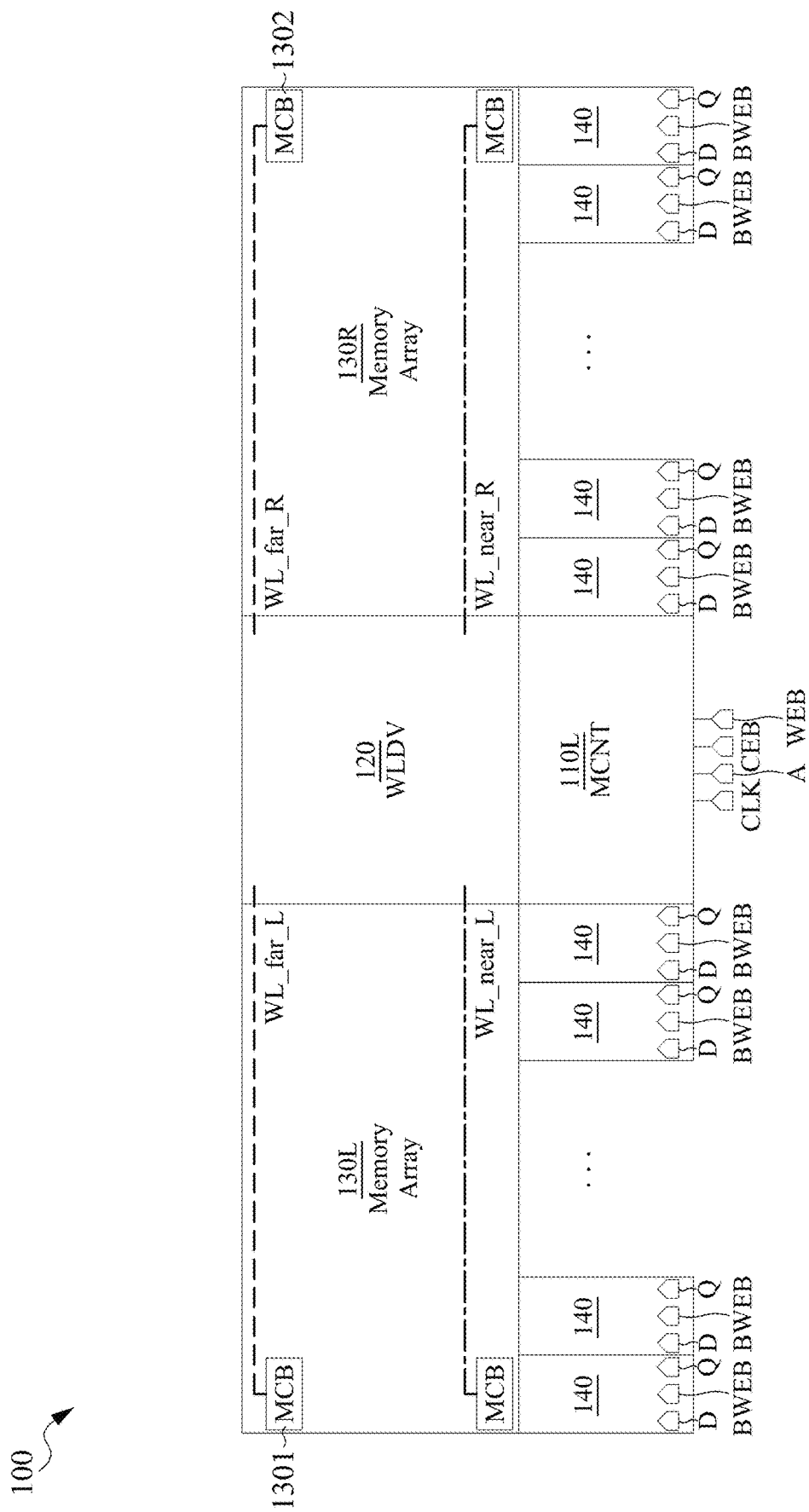
FIG. 4 is a diagram of the memory device 100 in accordance with the embodiment of FIG. 1A.
Figure 5:
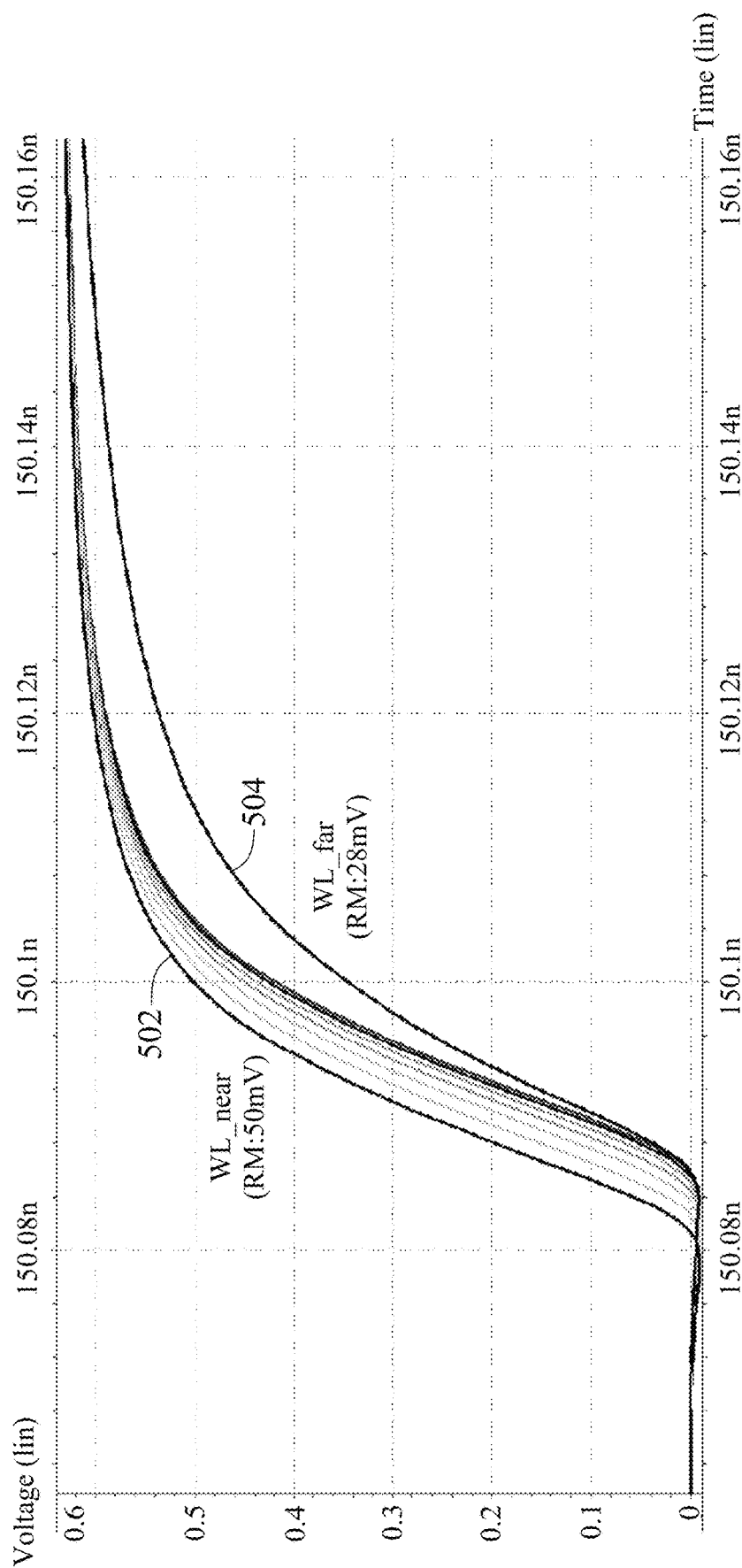
FIG. 5 is diagram showing relationships between voltage and time for different word lines in accordance with the embodiment of the FIG. 4.

FIG. 4 is a diagram of the memory device 100 in accordance with the embodiment of FIG. 1A. FIG. 5 is diagram showing relationships between voltage and time for different word lines in accordance with the embodiment of the FIG. 4. Please refer to FIGS. 4-5.

For purposes of description, the tracking circuit 150 is omitted from FIG. 4. The memory arrays 130L and 130R may include a plurality of memory cell blocks (MCB) 1302, and each memory cell block 1302 may include a plurality of memory cells (not shown). When the LSB of the decoded row address generated by the memory controller 110 is 0, the word line driver 120 will trigger the word line WL_near (e.g., WL_near_L or WL_near_R). At this time, the read margin will be larger (e.g., 50 mV) due to a better word-line rising slew rate, as shown by curve 502 in FIG. 5. When the MSB of the decoded row address generated by the memory controller 110 is 0, the word line driver 120 will trigger the word line WL_far (e.g., WL_far_L or WL_far_R). At this time, the read margin will be smaller (e.g., 28 mV) due to a worse word-line rising slew rate, as shown by curve 504 in FIG. 5. Here, the read margin may refer to the voltage difference between the bit lines BL and BLB shown in FIG. 1B. When the read margin exceeds a predetermined voltage threshold, the memory controller 110 may assert the sense amplifier enable signal SAE to enable the sense amplifier 1301 in FIG. 1B to read the value of the activated memory cell.

Due to the aforementioned characteristics of different read margins between the farthest word line (i.e., with the MSB being 0) and the nearest word line (i.e., with the LSB being 0), the read margin will be determined by the farthest word line WL_far, and the memory device 100 may be designed to satisfy this read margin. As a result, if no compensation for the read margin is performed, the duration of the clock control signal CKPB in the low logic state for the activated nearest word line WL_near will be longer than in the low logic state for the activated farthest word line WL_far, resulting in higher active power of the memory device 100 while activating the nearest word line WL_near.

Figure 6:
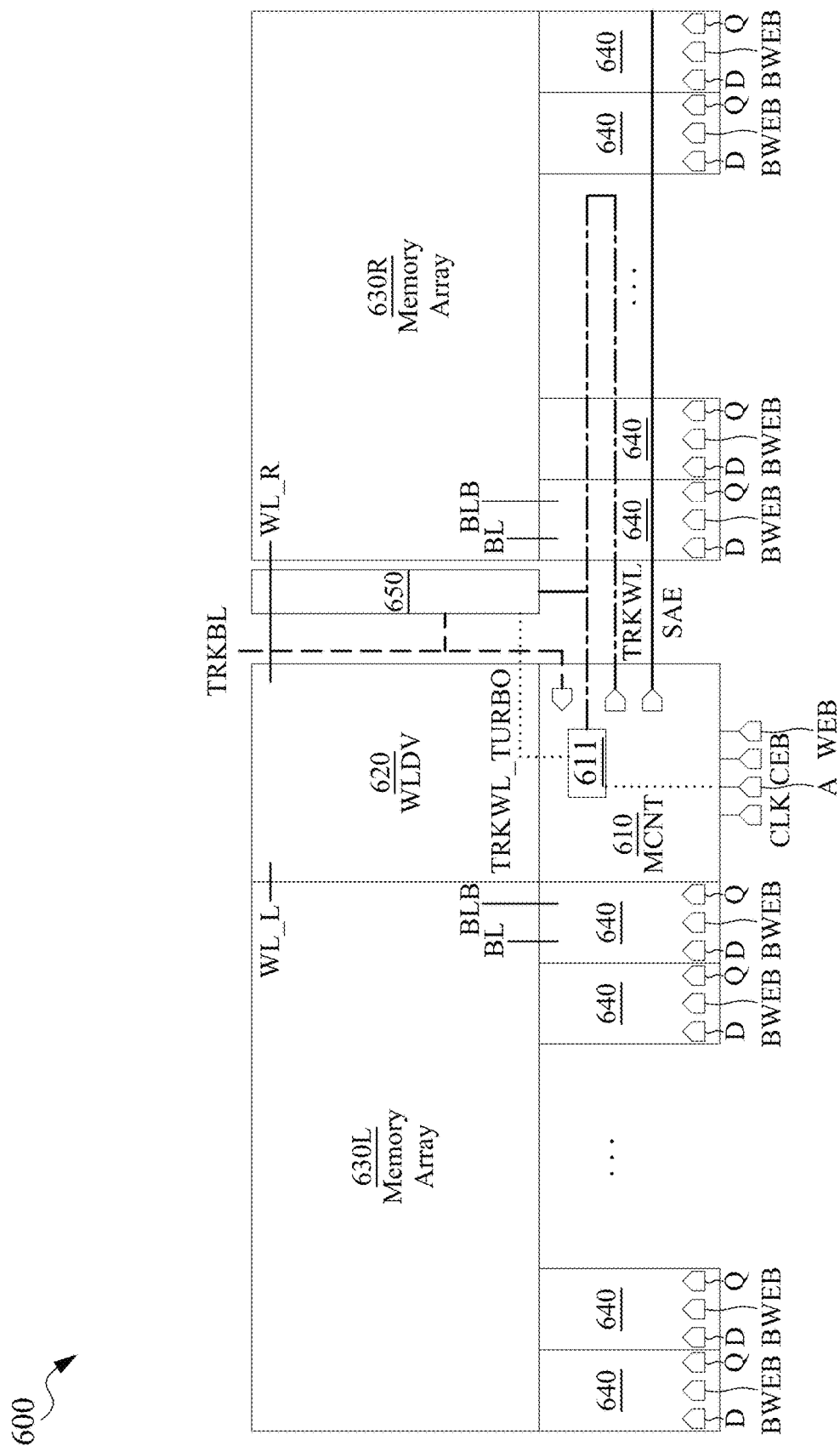
FIG. 6 is a block diagram of a memory device 600 in accordance with another embodiment of the present disclosure.
Figure 7:
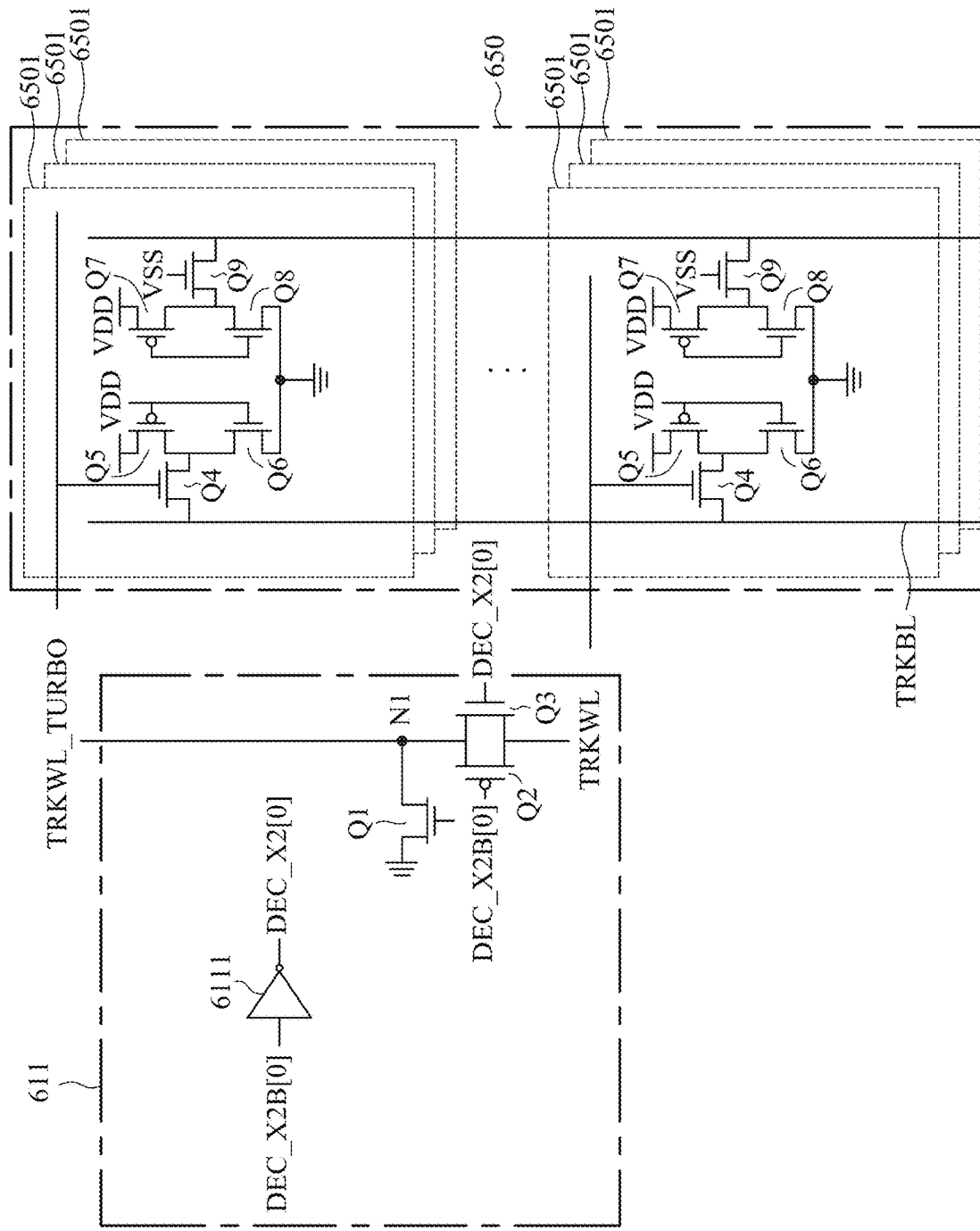
FIG. 7 is a schematic diagram of the tracking acceleration circuit 611 in the memory controller 610 in accordance with the embodiment of FIG. 6.

FIG. 6 is a block diagram of a memory device 600 in accordance with another embodiment of the present disclosure. FIG. 7 is a schematic diagram of the tracking acceleration circuit 611 in the memory controller 610 in accordance with the embodiment of FIG. 6. Please refer to FIGS. 6-7.

The memory device 600 shown in FIG. 6 may be similar to the memory device 100 shown in FIG. 1A, with the difference therebetween that the memory controller 610 of the memory device 600 may further include a tracking acceleration circuit 611 that is configured to generate a tracking acceleration signal TRKWL_TURBO in response to the LSB (i.e., DEC_X2B[0]) of the first decoded row address DEC_X2B. In addition, the tracking circuit 650 may include a plurality of tracking arrays 6501 which share the same tracking bit line TRKBL, as shown in FIG. 7. It should be noted that the tracking arrays 6501 in the upper portion of the tracking circuit 650 may be controlled by the tracking acceleration signal TRKWL_TURBO, and the tracking arrays 6501 in the lower portion of the tracking circuit 650 may be controlled by the tracking word line TRKWL. In some embodiments, there may be at least one tracking array 6501 in the upper portion of the tracking circuit 650, and there may be at least one tracking array 6501 in the lower portion of the tracking circuit 650. In addition, the numbers of the tracking arrays 6501 in the upper portion and in the lower portion of the tracking circuit 650 can be adjusted according to practical needs.

Given that the input address A has N bits (i.e. A[N−1:0]), the memory controller 110 may generate a corresponding first decoded row address signal DEC_X2B[N−1:0]. In response to the MSB (i.e., DEC_X2B[N−1]) of the first decoded row address signal DEC_X2B being 0, the tracking scheme performed by the tracking circuit 150 may remain the same to satisfy the limitation of the read margin of bit lines BL and BLB for the farthest word line WL_far. In response to the LSB (i.e., DEC_X2B[0]) of the first decoded row address signal DEC_X2B being 0, the tracking scheme performed by the tracking circuit 150 may be changed by the tracking acceleration signal TRKWL_TURBO generated by the tracking acceleration circuit 611 of the memory controller 610. More details are described in the following sections.

The schematic diagram of the tracking acceleration circuit 611 is shown in FIG. 7. The tracking acceleration circuit 611 may include an inverter 6111 and transistors Q1 to Q3. The inverter 6111 may invert the LSB (i.e., DEC_X2B[0]) of the first decoded row address signal DEC_X2B to obtain an inversed bit DEC_X2[0]. The LSB DEC_X2B[0] is input to the gate of transistor Q1 and the gate of transistor Q2. The inversed bit DEC_X2[0] is input to the gate of transistor Q3. It should be noted that transistor Q1 may be a switch controlled by the LSB DEC_X2B[0], and the transistors Q2 and Q3 forms a CMOS transmission gate which receives the tracking word line TRKWL as its input.

For example, in response to the LSB DEC_X2B[0] being 1 and the inversed bit DEC_X2[0] being 0, the transmission gate (i.e., transistors Q2 and Q3) is turned off, and transistor Q1 is turned on. Thus, the voltage level at node N1 is pulled down to the ground (e.g., 0V). At this time, the tracking acceleration signal TRKWL_TURBO is in the low logic state, and therefore the tracking arrays 6501 in the upper portion of the tracking circuit 650 will not be activated to pull down the voltage level of the tracking bit line TRKBL. Meanwhile, if the tracking word line TRKWL is in the high logic state, the tracking arrays 6501 in the lower portion of the tracking circuit 650 will be activated to pull down the voltage level of the tracking bit line TRKBL. If the tracking word line TRKWL is in the low logic state, the tracking arrays 6501 in the lower portion of the tracking circuit 650 will not be activated to pull down the voltage level of the tracking bit line TRKBL.

In addition, in response to the LSB DEC_X2B[0] being 0 and the inversed bit DEC_X2[0] being 1, the transmission gate (i.e., transistors Q2 and Q3) is turned on, and transistor Q1 is turned off. Thus, the tracking word line TRKWL passes through the transmission gate to obtain the tracking acceleration signal TRKWL_TURBO at node N1. The tracking acceleration signal TRKWL_TURBO is further input to the tracking arrays 6501 in the upper portion of the tracking circuit 650. At this time, if the tracking word line TRKWL is in the high logic state, the tracking acceleration signal TRKWL_TURBO is also in the high logic state. Thus, the tracking arrays 6501 in the lower portion and the upper portion of the tracking circuit 650 will be activated to pull down the voltage level of the tracking bit line TRKBL. In other words, more tracking arrays 6501 (i.e., upper portion and lower portion of the tracking circuit 650) are used to pull down the voltage level of the tracking bit line TRKBL, so the voltage level of the tracking bit line TRKBL can be pulled down to the ground (e.g., 0V) more quickly compared with the tracking arrays 6501 in the lower portion of the tracking circuit 650 being used to pull down the voltage level of the tracking bit line TRKBL.

In an embodiment, each of the tracking arrays 6501 may include transistors Q4 to Q9. The gate of transistor Q6 is connected to the power source voltage VDD, and thus transistor Q6 is turned on. In addition, the gate of transistor Q4 is controlled by the tracking acceleration signal TRKWL_TURBO. In response to the tracking acceleration signal TRKWL_TURBO being in the high logic state (i.e., TRKWL is also in the high logic state), transistor Q4 is turned on. At this time, a conductive path is formed from the tracking bit line TRKBL to the ground through transistors Q4 and Q6. In response to the tracking acceleration signal TRKWL_TURBO being in the low logic state (i.e., DEC_X2B[0]=1, or DEC_X2B[0]=0 and TRKWL is at logic 0), transistor Q4 is turned off, and the tracking arrays 6501 in the upper portion of the tracking circuit 650 will not be activated to discharge the tracking bit line TRKBL.

Figure 8:
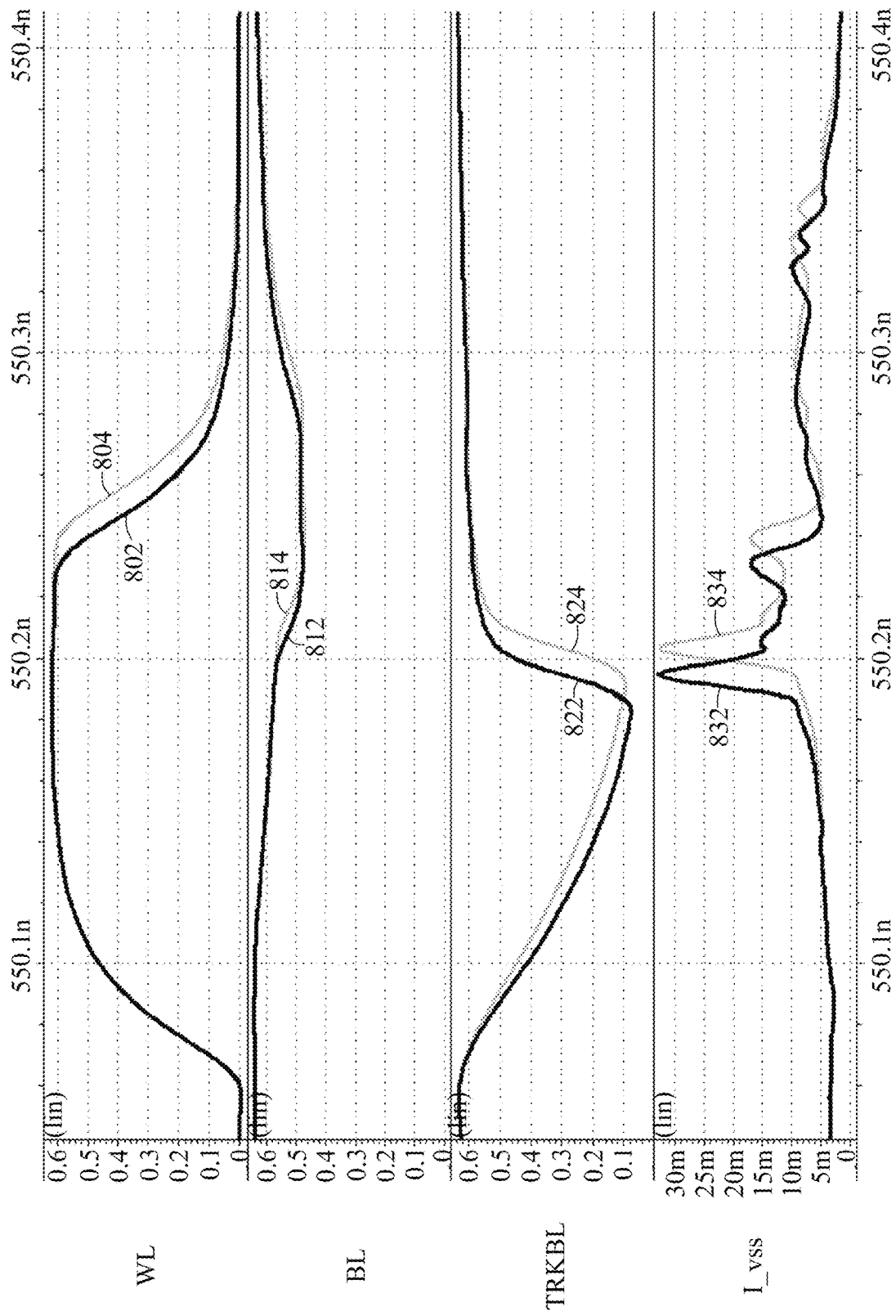
FIG. 8 is a waveform diagram of various signals with and without the address control scheme in accordance with the embodiment of FIG. 6.

For example, as shown by the waveforms in FIG. 8, curves 802, 812, 822, and 832 respectively denote the word line WL, bit line BL, tracking bit line TRKBL, and current I_VSS while using the tracking acceleration signal TRKWL_TURBO to activate more tracking arrays 6501 in the tracking circuit 650. Curves 804, 814, 824, and 834 respectively denote the word line WL, bit line BL, tracking bit line TRKBL, and current I_VSS without using the tracking acceleration signal TRKWL_TURBO to activate more tracking arrays 6501 in the tracking circuit 650. Given that the type of the memory device 600 is 1024×72, the active power of the memory device 600 can be reduced by approximately 2% by simulation using the tracking acceleration signal TRKWL_TURBO.

Figure 9:
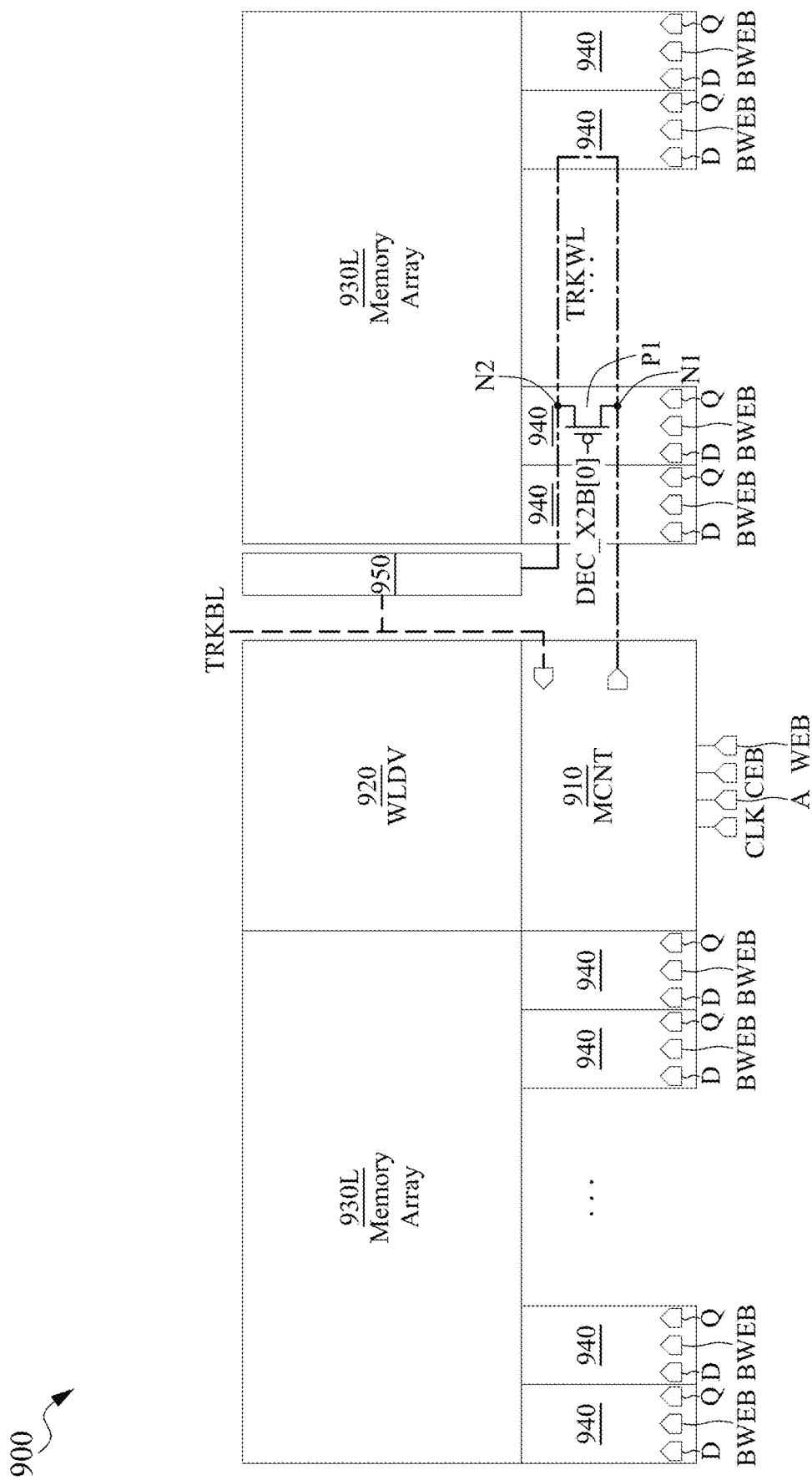
FIG. 9 is a block diagram of a memory device 900 in accordance with yet another embodiment of the present disclosure.
Figure 10:
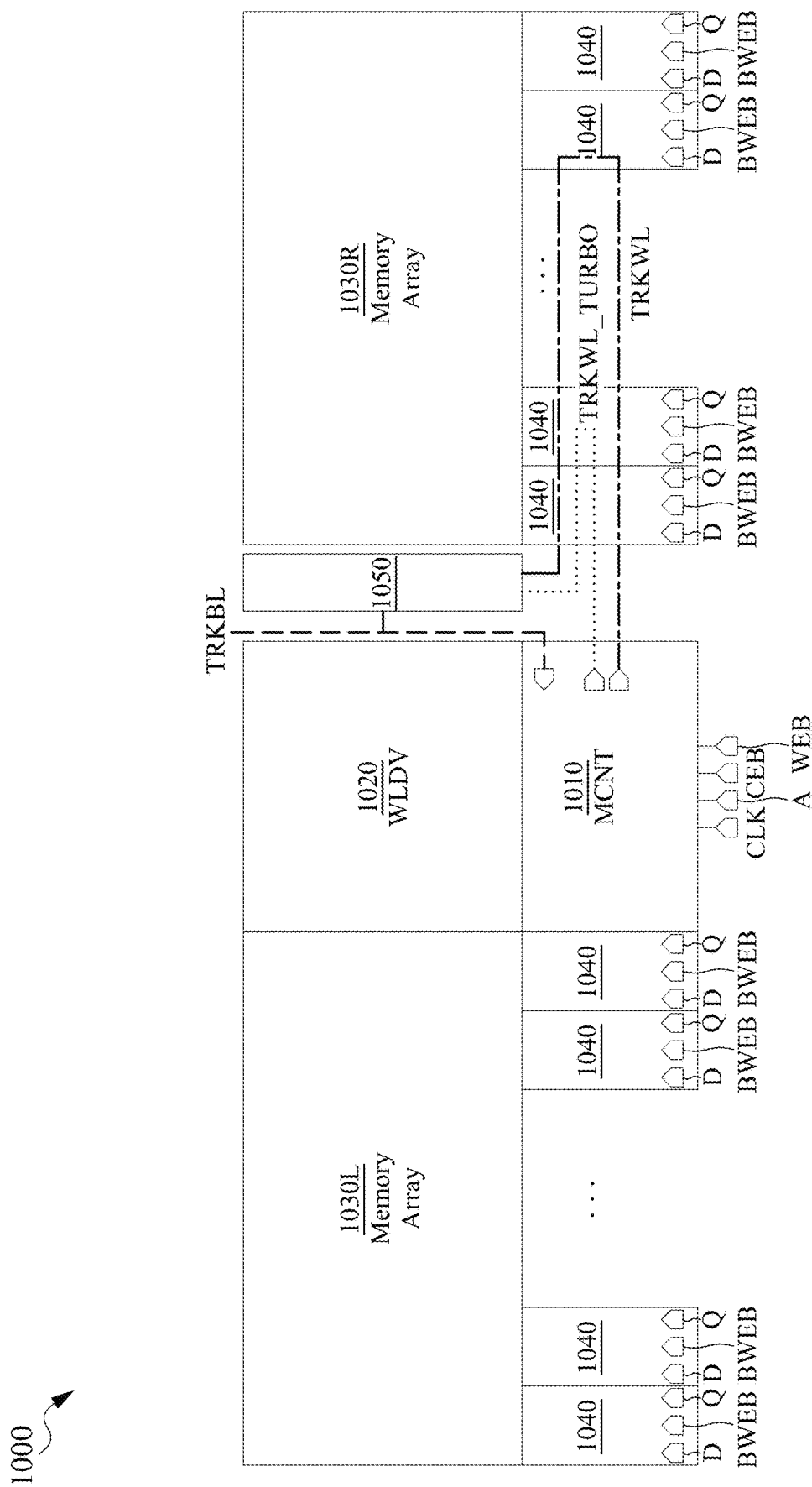
FIG. 10 is a block diagram of a memory device 1000 in accordance with yet another embodiment of the present disclosure.
Figure 11:
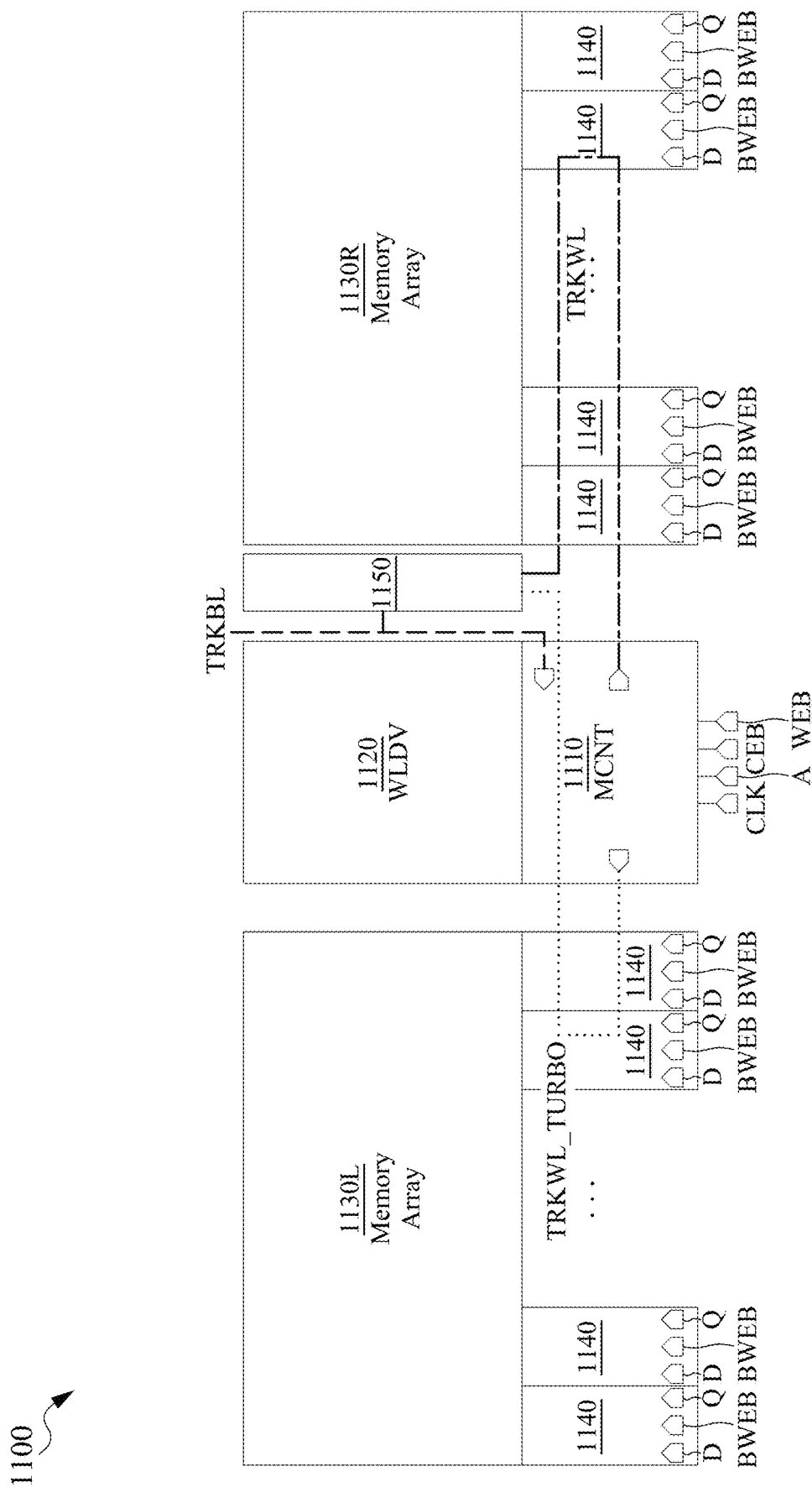
FIG. 11 is a block diagram of a memory device 1100 in accordance with yet another embodiment of the present disclosure.

It should be noted that the tracking acceleration circuit 611 may be implemented in the memory controllers 910, 1010, 1110 in the embodiments of FIGS. 9 to 11 to generate the tracking acceleration signal TRKWL_TURBO.

FIG. 9 is a block diagram of a memory device 900 in accordance with yet another embodiment of the present disclosure.

The memory device 900 shown in FIG. 9 may be similar to the memory device 100 shown in FIG. 1A, with the difference that a switch P1 is disposed between a first node N1 and a second point N2 on the routing path of the tracking word line TRKWL in FIG. 9. For example, the routing path of the tracking word line TRKWL may start from the memory controller 910, and turn around at one I/O pad 940 (e.g., the second right most I/O pad 940 in this example), and then reach the tracking circuit 950, as shown in FIG. 9.

Specifically, the RC loading of the routing path of the tracking word line TRKWL increases as the length of the routing path increases. The switch P1 may be implemented by a P-type transistor that is controlled by the LSB (e.g., DEC_X2B[0]) of the first decoded row address signal DEC_X2B. Thus, in response the LSB (e.g., DEC_X2B[0]) of the first decoded row address signal DEC_X2B being 0, the switch P1 is turned on, and the routing path of the tracking word line TRKWL is shortened since the current from the memory controller 910 to the tracking circuit 950 will flow through the switch P1 along a shorter routing path rather than through the far end of the original routing path of the tracking word line TRKWL. Therefore, since the routing path of the tracking word line TRKWL is shortened, the RC loading of the tracking word line TRKWL is also reduced. As a result, the slew rate of the voltage level of the tracking word line TRKWL may become higher, so the tracking word line TRKWL may be charged to the high logic state more quickly. In addition, a faster rising speed of the voltage level of the tracking word line TRKWL may lead to a faster falling speed of the voltage level of the tracking bit line TRKBL. Thus, the duration of the clock control signal CKPB may be shorter when the LSB (e.g., DEC_X2B[0]) of the first decoded row address signal DEC_X2B is 0, so the active power of the memory device 900 can be reduced.

FIG. 10 is a block diagram of a memory device 1000 in accordance with yet another embodiment of the present disclosure.

The memory device 1000 shown in FIG. 10 may be similar to the memory device 100 shown in FIG. 1A, with the difference that the tracking acceleration signal TRKWL_TURBO may be issued from the memory controller 1010 using another metal wire different from the tracking word line TRKWL. For example, the routing path of the tracking word line TRKWL may start from the memory controller 1010, and turn around at a first I/O pad 1040 (e.g., the second right most I/O pad 1040 in this example), and then reach the tracking circuit 1050, as shown in FIG. 10. In addition, the routing path of the metal wire of the tracking acceleration signal TRKWL_TURBO may also start from the memory controller 1010, and turn around at a second I/O pad 1040, and then reach the tracking circuit 1050. The second I/O pad 1040 may be closer to the memory controller 1010 than the first I/O pad 1040. In addition, the tracking word line TRKWL and the tracking acceleration signal TRKWL_TURBO may control different tracking arrays (not shown in FIG. 10) in the tracking circuit 1050, which is similar to the embodiment in FIG. 7.

In some embodiments, in response to the LSB (e.g., DEC_X2B[0]) of the first decoded row address signal DEC_X2B being 0, the memory controller 1010 may assert the tracking word line TRKWL and the tracking acceleration signal TRKWL_TURBO, so more tracking arrays in the tracking circuit 1050 can be activated in addition to the tracking arrays activated by the tracking word line TRKWL, thereby increasing the pulling down speed of the tracking bit line TRKBL. As a result, the slew rate of the voltage level of the tracking word line TRKWL may become higher, so the tracking word line TRKWL may be charged to the high logic state more quickly. In addition, a faster rising speed of the voltage level of the tracking word line TRKWL may lead to a faster falling speed of the voltage level of the tracking bit line TRKBL. Thus, the duration of the clock control signal CKPB may be shorter when the LSB (e.g., DEC_X2B[0]) of the first decoded row address signal DEC_X2B is 0, so the active power of the memory device 1000 can be reduced.

In some other embodiments, in response to the LSB (e.g., DEC_X2B[0]) of the first decoded row address signal DEC_X2B being 0, the memory controller 1010 may assert the tracking acceleration signal TRKWL_TURBO rather than the tracking word line TRKWL. Since the routing path of the metal wire of the tracking acceleration signal TRKWL_TURBO is shorter than the routing path of the tracking word line TRKWL, the metal wire of the tracking acceleration signal TRKWL_TURBO can be charged to the high logic state more quickly. This may lead to a faster falling speed of the voltage level of the tracking bit line TRKBL. Thus, the duration of the clock control signal CKPB may be shorter when the LSB (e.g., DEC_X2B[0]) of the first decoded row address signal DEC_X2B is 0, so the active power of the memory device 1000 can be reduced.

FIG. 11 is a block diagram of a memory device 1100 in accordance with yet another embodiment of the present disclosure.

The memory device 1000 shown in FIG. 10 may be similar to the memory device 100 shown in FIG. 1A, with the difference that the tracking acceleration signal TRKWL_TURBO may be issued from the memory controller 1010 using another metal wire different from the tracking word line TRKWL. The tracking word line TRKWL and the metal wire of the tracking acceleration signal TRKWL_TURBO may be located at opposite sides of the memory controller 1110 in the physical layout of the memory device 1100.

Specifically, during manufacture of the memory device 1100, the mask for the I/O pads 1140 may be repeatedly used, so there is a metal layer dedicated for the tracking word line TRKWL. Since the tracking word line TRKWL is disposed on the right side of the memory controller 1110, there is still another metal wire on the left side of the memory controller 1110, and this metal wire can be used for the tracking acceleration signal TRKWL_TURBO. It should be noted that the routing path of the metal wire for the tracking acceleration signal TRKWL_TURBO may be shorter than the routing path of the tracking word line TRKWL. The control scheme of the tracking arrays (not shown in FIG. 11) of the tracking circuit 1150 is similar to that in the aforementioned embodiments, and thus the details will not be repeated here.

It should be noted that different schemes for reducing the active power of the memory device for a memory read operation described in the aforementioned embodiments can be performed individually or in combination.

Figure 12:
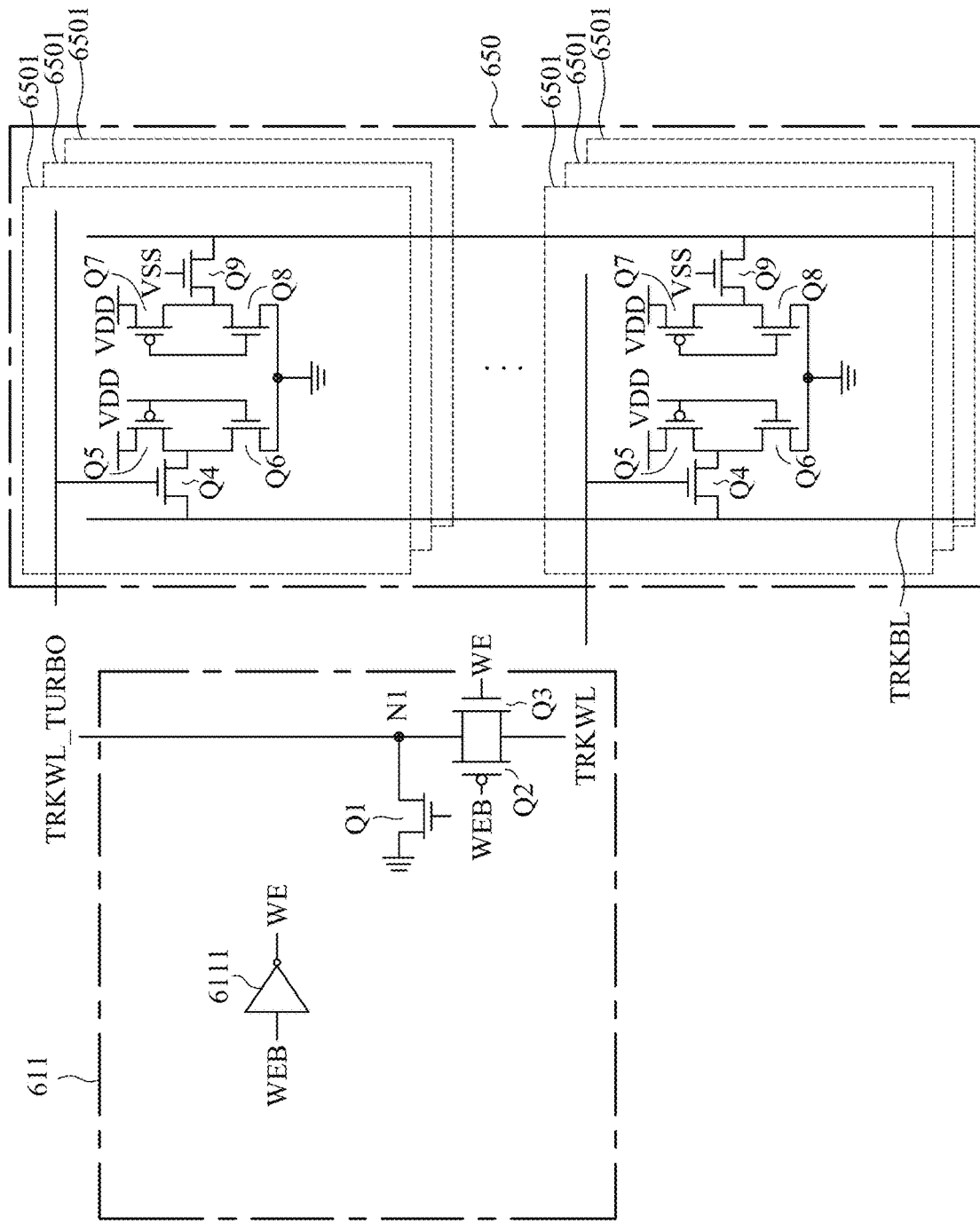
FIG. 12 is another schematic diagram of the tracking acceleration circuit 611 in the memory controller 610 in accordance with the embodiments of FIG. 6.

FIG. 12 is another schematic diagram of the tracking acceleration circuit 611 in the memory controller 610 in accordance with the embodiments of FIG. 6.

As described in the embodiment of FIG. 7, the tracking acceleration circuit 611 may be used for a memory read operation of the memory device 600, and it can also be used in the memory controllers 910, 1010, and 1100 in the embodiments of FIGS. 9-11 to reduce the active power of the memory devices 900, 1000, and 1100 during a memory read operation. In some embodiments, the tracking acceleration circuit 611 can be modified for a memory write operation of the memory device 600.

Specifically, the write enable signal WEB may direct the memory device 600 to perform a memory read operation or a memory write operation. Thus, the write enable signal WEB may be used as the control signal of transistor Q1 and the transmission gate (e.g., transistors Q2 & Q3), as shown in FIG. 12. In response to the write enable signal WEB being in the high logic state, transistors Q1 to Q3 are turned off, and the voltage level of the tracking word line TRKWL will not pass through the transmission gate. Thus, the tracking arrays 6501 controlled by the tracking acceleration signal TRKWL_TURBO will not be activated. In response to the write enable signal WEB being in the low logic state, transistors Q1 to Q3 are turned on, and the voltage level of the tracking word line TRKWL will pass through the transmission gate (e.g., transistors Q2 & Q3) to obtain the tracking acceleration signal TRKWL_TURBO at node N1. Thus, the tracking arrays 6501 controlled by the tracking acceleration signal TRKWL_TURBO will be activated in addition to the tracking arrays 6501 controlled by the tracking word line TRKWL.

Therefore, the active power of the memory device 600 for performing a memory write operation can be reduced in a manner similar to the memory read operation described in the embodiments of FIGS. 1 to 11. It should be noted that a memory write command and a memory read command may be collectively referred to as a memory access command. Similarly, a memory write operation and a memory read command may be collectively referred to as a memory access operation.

It should be noted that the control schemes for reducing active power of the memory device for the memory read operation and the memory write operation described in the aforementioned embodiments can be performed individually or in combination.

Figure 13:
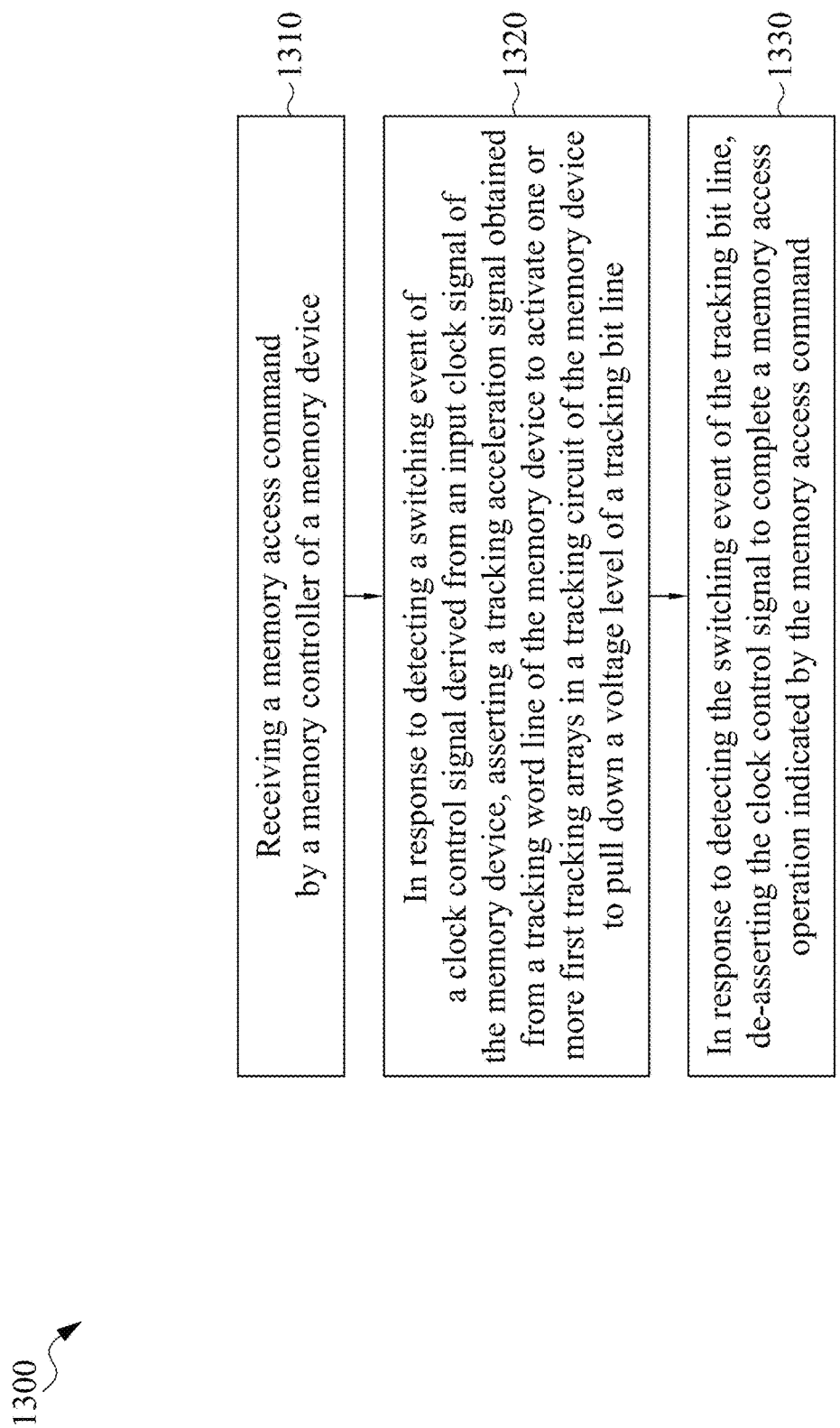
FIG. 13 is a flowchart of a method for reducing active power consumption of a memory device in accordance with an embodiment of the present disclosure.

FIG. 13 is a flowchart of a method for reducing active power consumption of a memory device in accordance with an embodiment of the present disclosure. Please refer to FIG. 1A and FIG. 13.

In operation 1310, a memory access command is received by a memory controller 110 of a memory device 100. For example, the memory access command may be a memory read command or a memory write command.

In operation 1320, in response to detecting a switching event of a clock control signal (e.g., CKPB) derived from an input clock signal (e.g., CLK) of the memory device 100, an tracking acceleration signal (e.g., TRKWL_TURBO) obtained from a tracking word line (e.g., TRKWL) of the memory device 100 is asserted to activate one or more first tracking arrays in a tracking circuit 150 to pull down a voltage level of a tracking bit line. For example, the switching event may refer to a falling edge from the high logic state to the low logic state. For example, when the memory access command is a memory read command, the tracking acceleration circuit 611 shown in FIG. 7 may be used, and the LSB (i.e., DEC_X2B[0]) of the first decoded row address DEC_X2B may be used as the control signal of the tracking acceleration circuit 611. In addition, when the memory access command is a memory write command, the tracking acceleration circuit 611 shown in FIG. 12 may be used, and the write enable signal WEB may be used as the control signal of the tracking acceleration circuit 611.

In operation 1330, in response to detecting the switching event of the tracking bit line (e.g., TRKBL), the clock control signal (e.g., CKPB) is de-asserted to complete a memory access operation indicated by the memory access command. For example, the tracking acceleration circuit 611 may activate more tracking arrays 6501 in the tracking circuit 650 in addition to the tracking arrays 6501 activated by the tracking word line TRKWL, so the tracking bit line TRKBL can be pulled down to the ground (e.g., 0V) more quickly. When the switching event of the tracking bit line TRKBL is detected, the memory controller 110 may de-assert the clock control signal CKPB to complete the memory access operation indicated by the memory access command. Thus, the duration of the clock control signal CKPB being in the low logic state can be reduced, and the active power of the memory device 100 can be reduced as well.

In an embodiment, the present disclosure provides a memory device, including a memory array, a plurality of word lines, a tracking circuit, a memory controller, and a word line driver. The memory array includes a plurality of memory cells. The plurality of word lines are in communication with the plurality of memory cells of the memory array. The memory controller is configured to decode a memory address of a memory access command to generate a decoded row address signal. The word line driver is configured to assert one of the plurality of word lines in response to the decoded row address signal. In response to detecting a switching event of a clock control signal derived from an input clock signal of the memory device, the memory controller asserts an tracking acceleration signal obtained from a tracking word line of the memory device to activate one or more first tracking arrays of the plurality of tracking arrays to pull down a voltage level of a tracking bit line.

In another embodiment, the present disclosure provides a memory device, including a memory array, a plurality of word lines, a tracking circuit, a memory controller, and a word line driver. The memory array includes a plurality of memory cells. The plurality of word lines are in communication with the plurality of memory cells of the memory array. The word line driver is configured to assert one of the plurality of word lines in response to the decoded row address signal. In response to detecting that a write enable signal indicated by the memory access command is in a low logic state, the memory controller asserts a tracking acceleration signal obtained from a tracking word line of the memory device to activate one or more first tracking arrays of the plurality of tracking arrays to pull down a voltage level of a tracking bit line.

In yet another embodiment, the present disclosure provides a method for reducing active power of a memory device, the method includes the following steps: receiving a memory access command by a memory controller of a memory device; and in response to detecting a switching event of a clock control signal derived from an input clock signal of the memory device, asserting, by the memory controller, an acceleration tracking signal obtained from a tracking word line of the memory device to activate one or more first tracking arrays in a tracking circuit of the memory device to pull down a voltage level of a tracking bit line.

The methods and features of the present disclosure have been sufficiently described in the provided examples and descriptions. It should be understood that any modifications or changes without departing from the spirit of the present disclosure are intended to be covered in the protection scope of the present disclosure.

Moreover, the scope of the present application is not intended to be limited to the particular embodiments of the process, machine, manufacture, and composition of matter, means, methods and steps described in the specification. As those skilled in the art will readily appreciate from the present disclosure, processes, machines, manufacture, composition of matter, means, methods or steps presently existing or later to be developed, that perform substantially the same function or achieve substantially the same result as the corresponding embodiments described herein, can be utilized according to the present disclosure.

Accordingly, the appended claims are intended to include within their scope: processes, machines, manufacture, compositions of matter, means, methods or steps. In addition, each claim constitutes a separate embodiment, and the combination of various claims and embodiments are within the scope of the present disclosure.

What is claimed is:

1. A memory device, comprising:
   a memory array, comprising a plurality of memory cells;
   a plurality of word lines, in communication with the plurality of memory cells of the memory array;
   a tracking circuit, comprising a plurality of tracking arrays;
   a memory controller, configured to decode a memory address indicated by a memory access command to generate a decoded row address signal; and
   a word line driver, configured to assert one of the plurality of word lines in response to the decoded row address signal;
   wherein in response to detecting a switching event of a clock control signal derived from an input clock signal of the memory device, the memory controller asserts a tracking acceleration signal obtained from a tracking word line of the memory device to activate one or more first tracking arrays of the plurality of tracking arrays to pull down a voltage level of a tracking bit line.

2. The memory device of claim 1, wherein the asserted word line is associated with a least significant bit (LSB) of the decoded row address signal.

3. The memory device of claim 1, wherein the switching event refers to a falling edge from a high logic state to a low logic state.

4. The memory device of claim 3, wherein in response to detecting a rising edge of the input clock signal, the memory controller switches the clock control signal from the high logic state to the low logic state.

5. The memory device of claim 4, wherein in response to detecting the switching event of the clock control signal, the memory controller asserts the tracking word line from the low logic state to the high logic state.

6. The memory device of claim 5, wherein the tracking word line controls one or more second tracking arrays of the plurality of tracking arrays, and the one or more second tracking arrays are different from the one or more first tracking arrays.

7. The memory device of claim 6, wherein in response to the tracking word line being in the high logic state, the one or more second tracking arrays are activated by the tracking word line to pull down the voltage level of the tracking bit line.

8. The memory device of claim 1, wherein a first routing path of the tracking word line is longer than a second routing path of a conductive wire of the tracking acceleration signal.

9. The memory device of claim 8, wherein the first routing path and the second routing path are disposed on opposite sides of the memory controller in a physical layout of the memory device.

10. The memory device of claim 2, wherein a switch disposed between a first node and a second node of a first routing path of a tracking word line is turned on to change the first routing path to a second routing path, and the second routing path is shorter than the first routing path.

11. The memory device of claim 1, further comprising a sense amplifier, wherein in response to detecting the switching event of the tracking bit line, the memory controller asserts an sense amplifier enable signal to activate the sense amplifier to sense a value stored in one of the memory cells selected by the memory address.

12. A memory device, comprising:
 a memory array, comprising a plurality of memory cells;
 a plurality of word lines, in communication with the plurality of memory cells of the memory array;
 a tracking circuit, comprising a plurality of tracking arrays;
 a memory controller, configured to decode a memory address indicated by a memory access command to generate a decoded row address signal; and
 a word line driver, configured to assert one of the plurality of word lines in response to the decoded row address signal;
 wherein in response to detecting that a write enable signal indicated by the memory access command is in a low logic state, the memory controller asserts a tracking acceleration signal obtained from a tracking word line of the memory device to activate one or more first tracking arrays of the plurality of tracking arrays to pull down a voltage level of a tracking bit line.

13. The memory device of claim 12, wherein the tracking word line controls one or more second tracking arrays of the plurality of tracking arrays.

14. The memory device of claim 13, wherein the one or more second tracking arrays are different from the one or more first tracking arrays.

15. The memory device of claim 13, wherein the memory controller comprises a tracking acceleration circuit which comprises:
 a transistor, having a gate controlled by the write enable signal, a source connected to a ground, and a drain connected to a first node; and
 a transmission gate, electrically coupled between the first node and the tracking word line.

16. The memory device of claim 15, wherein in response to the write enable being in the low logic state, the transistor is turned off, and the transmission gate is turned on to obtain the tracking acceleration signal at the first node.

17. A method for reducing active power consumption of a memory device, the method comprising:
 receiving a memory access command by a memory controller of a memory device; and
 in response to detecting a switching event of a clock control signal derived from an input clock signal of the memory device, asserting, by the memory controller, an acceleration tracking signal obtained from a tracking word line of the memory device to activate one or more first tracking arrays in a tracking circuit of the memory device to pull down a voltage level of a tracking bit line.

18. The method of claim 17, wherein the asserted word line is associated with a least significant bit (LSB) of a decoded row address signal generated by the memory controller.

19. The method of claim 17, wherein the switching event refers to a falling edge from a high logic state to a low logic state.

20. The method of claim 17, wherein the tracking word line controls one or more second tracking arrays in the tracking circuit, and the one or more second tracking arrays are different from the one or more first tracking arrays.

* * * * *